United States Patent
Spinella

(10) Patent No.: US 10,396,773 B2
(45) Date of Patent: Aug. 27, 2019

(54) CIRCUIT AND A METHOD FOR DRIVING ELECTRICAL LOADS

(71) Applicant: EGGTRONIC ENGINEERING S.R.L., Modena (IT)

(72) Inventor: Igor Spinella, Modena (IT)

(73) Assignee: EGGTRONIC ENGINEERING S.R.L., Modena (IT)

( * ) Notice: Subject to any disclaimer, the term of this patent is extended or adjusted under 35 U.S.C. 154(b) by 0 days.

(21) Appl. No.: 16/086,149

(22) PCT Filed: Feb. 27, 2017

(86) PCT No.: PCT/IB2017/051136
§ 371 (c)(1),
(2) Date: Sep. 18, 2018

(87) PCT Pub. No.: WO2017/158458
PCT Pub. Date: Sep. 21, 2017

(65) Prior Publication Data
US 2019/0089342 A1    Mar. 21, 2019

(30) Foreign Application Priority Data

Mar. 18, 2016 (IT) .................. 102016000028817

(51) Int. Cl.
*H03K 17/0416* (2006.01)
*H03K 17/687* (2006.01)

(52) U.S. Cl.
CPC ....... *H03K 17/0416* (2013.01); *H03K 17/687* (2013.01); *H03K 2217/009* (2013.01)

(58) Field of Classification Search
CPC ............. H03K 17/0416; H03K 17/687; H03K 2217/009

USPC .... 327/108–112, 427, 434, 437; 326/82, 83, 326/87; 363/21.01–21.18
See application file for complete search history.

(56) References Cited

U.S. PATENT DOCUMENTS

| 5,939,941 A | 8/1999 | Nair et al. |
| 6,570,777 B1* | 5/2003 | Bennett ............ H03K 17/04163 363/21.02 |
| 8,536,930 B2* | 9/2013 | Hatsukawa ........... H03F 3/2171 326/83 |

(Continued)

FOREIGN PATENT DOCUMENTS

WO    2013014521 A1    1/2013

OTHER PUBLICATIONS

Dr Andrei Grebennikov, "High High-Efficiency Efficiency RF and Microwave Power Amplifiers: RF and Microwave Power Amplifiers: Historical Aspect and Modern Trends Historical Aspect and Modern Trends", 2009 Radio and Wireless Week Power Amplifier Symposium (Jan. 2009).

*Primary Examiner* — Tomi Skibinski
(74) *Attorney, Agent, or Firm* — Browdy and Neimark, PLLC

(57) ABSTRACT

A circuit and a corresponding method for driving one or more electric loads are described, comprising: a generator (110) of an electric current waveform, and a passive filter (150) connected in input to the generator (110) and in output to each electric load (105) to be driven, wherein the passive filter (150) is tuned for generating an electric current waveform resulting from a conditioning of one or more harmonics of the electric current waveform in input.

10 Claims, 12 Drawing Sheets

(56) References Cited

U.S. PATENT DOCUMENTS

| | | | |
|---|---|---|---|
| 2012/0169414 A1* | 7/2012 | Dupuy | H01P 1/2039 327/552 |
| 2013/0293189 A1* | 11/2013 | Low | H01F 38/14 320/108 |
| 2015/0098252 A1* | 4/2015 | Spinella | H02M 3/005 363/21.01 |
| 2015/0381057 A1* | 12/2015 | Luu | H02M 7/5387 363/21.01 |
| 2018/0102754 A1* | 4/2018 | Tanaka | H03H 7/38 |
| 2019/0068132 A1* | 2/2019 | Yamada | H03F 1/32 |
| 2019/0068142 A1* | 2/2019 | Tsutsui | H03F 3/213 |

* cited by examiner

CIRCUIT AND A METHOD FOR DRIVING ELECTRICAL LOADS

FIELD OF THE INVENTION

The present invention in general relates to a circuit and a method for driving one or more resistive, capacitive, inductive or mixed electric loads with an electric current waveform that is variable over time.

PRIOR ART

Driving electric loads with current waveforms that are variable over time are typically carried out using amplifier circuits in voltage and/or in current, which are configured for transforming a low-power frequency into a sufficiently powerful signal to correctly power the load.

According to the type of load to be powered, these circuits can implement linear type wiring diagrams (such as those used for example for amplifying audio signals), characterised by excellent fidelity, but low energy efficiency, non-linear diagrams (for example those based on SMOS stages or which use BJT pairs able to amplify digital signals), diagrams based on class D amplifiers or resonance diagrams, typically based on transformers, LC resonators or other resonant circuits (for example class E or class F amplifiers).

A sector in which driving is particularly important is when the load is constituted by a the gate of an active switch, for example a MOSFET, IGBT, HEMT transistor or another device having a considerable gate capacitance, to which is typically added a gate parasitic resistance and a gate parasitic inductance.

In particular, the drive is particularly problematic when the active switches are used in the field of high-frequency switching circuits, in which the switches themselves are typically used in saturation or cut-off regions.

In fact, while at low frequencies the currents in play are substantially negligible, as the active switches typically have insignificant parasitic capacitance (for example less than a few nF or a few hundred pF), at high frequencies the currents can normally reach up to tens of amperes, with consequent drive difficulties.

As well as the high currents necessary, the driving of the above-mentioned active switches often leads to considerable energy dissipation which is substantially inevitable.

In fact, for each switching on/off cycle of the switch, the gate capacitance thereof is appropriately loaded/unloaded, with an energy loss of:

$$Ed = \frac{1}{2} \cdot C \cdot V^2$$

where Ed indicates the dissipated energy, C indicates the parasitic capacitance of the switch, typically non-linear and decreasing as a function of the drive current, and V indicates the maximum drive current of the device. To these losses are added the gate resistance losses, proportional to the gate resistance and to the square of the effective RMS value of the current necessary for loading/unloading the gate and therefore proportional to the square of the gate capacitance. Like considerations can be made considering the total gate load of the capacitances.

Typically when the drive frequency exceeds 1 Mhz the losses in the drive circuit (also known as drivers) of the power devices become significant, in the order of Watts, up to reaching the tens or hundreds of Watts for greater frequencies or if switches are used—for example MOSFETs—particularly affected by parasitic phenomena, making a further increase of working frequency substantially impossible and risking destruction of the device.

This problem can partly be solved by using active switches to the RF field based on silicon or heterogeneous semiconductors (for example SiCs) or HEMDs based on III-V semiconductors (e.g. GaN) which enable reducing the gate capacitance.

These semiconductors typically have, however, the drawback of high cost and other drawbacks which make their drive difficult. For example high-voltage SiC based active switches require high gate voltages in order to be driven, with a consequent partial surrender of the benefit obtained from the reduction of the gate capacitance. HEMT devices based on type III-V heterojunctions (for example GaN) on the other hand have the problem of requiring negative voltages to be driven, which makes them poorly compatible with the present power hardware architectures, in particular in switching wiring diagrams, if not by making recourse to architectures of the cascode or multistage type.

A possible solution adopted in the field of radiofrequencies (RF) for solving the driving problems of the active switches having high gate capacitance consists in the use of inductive or resonating wiring diagrams, in which the gate drive is carried out substantially with a transformer or a resonant circuit (for example class E or F, or a simple LC resonator. This type of circuit, if appropriately dimensioned, has the advantage of not dissipating the energy accumulated in the gate parasitic capacitance, but of being able to reutilise it in each cycle, except for losses due to parasitic phenomena.

On the other hand, resonant diagrams of this type drive the load with a substantially sinusoidal wave, which can be useful in some hardwares, for example for circuits in which the efficiency is not critical, but which typically is deleterious for driving active switches in the field of switching circuits, in which the rise and fall times of the fronts must be as sharp as possible in order to limit the dynamic losses in the switches during the on/off and off/on transition steps.

Using the sinus waves to switch the active switches on and off can thus lead to a reduction in the gate losses, but enormously increases the dynamic losses in the power circuit, as the slope of the on/off and off/on transitions is typically not sufficiently steep to prevent and/or minimise voltage and current crossing in the power delivery stage.

These problems can be encountered in the driving of any capacitive type load with current waves, and in particular in the systems where two levels of current are used for switching the device on and off (switching systems), in particular for high functioning frequencies.

Similar problems also exist in logic circuits (logic gates of the AND, OR, NOT, NAND, NOR, XOR types etc., memories, buffers, more or less complex integrated circuits, microcontrollers, microprocessors, CMOS sensors, etc.), since though the parasitic capacitance of each gate is particularly small, the present very high degree of integration leads in any case to having a total gate capacity that substantially limits the maximum functioning frequency (today substantially limited to a few GHz), and enormously increases consumption of microprocessors, memories, microcontrollers, sensors, cabled logics, FPGA and any other digital device. The synchronising clock, the buffers for regenerating the clock to take account of the maximum number of drivable gates, the PLL and all the driving systems of the logic gates typically alone constitute about 50% of the losses in modern digital systems.

Problems of analog type can be encountered in the high-frequency power supply of inductive or resistive loads.

An aim of the present invention therefore consists in realising a circuit that is useful for driving an electric load having a capacitive and/or resistive and/or inductive behaviour with an electric current waveform adequate for correct functioning of the load, thus substantially reducing the losses and at the same time increasing the maximum drive frequency possible with respect to known circuits.

DESCRIPTION OF THE INVENTION

An embodiment of the present invention relates to a circuit for driving one or more electrical loads, comprising at least:
- a generator of an electric current waveform (for example a current waveform in which the frequency of the main harmonic is equal to or greater than a Mhz, about ten or about a hundred Mhz, sometimes even greater than 1 Ghz or tens or hundreds of Ghz), and
- a passive filter connected in input to the generator and in output to each electric load to be driven, wherein the passive filter is tuned for generating an electric current waveform resulting from a conditioning of one or more harmonics of the electric current waveform in input.

By conditioning of a harmonic of the current waveform is meant the possibility of selectively increasing (amplifying) or reducing (damping) the specific harmonic component (harmonic) of the current waveform.

In this way it is effectively possible to "shape" the current waveform that drives the electric load/s, so that the most suitable shape can be given to it (in the time domain) for minimising losses and/or for increasing the efficiency and drive effectiveness on the basis of the specific needs of the load/s to be driven.

In the present invention, the electrical load/s can be substantially of any type, for example resistive, capacitive, inductive loads or a combination of the resistive, capacitive and inductive loads The present invention is however particularly useful for driving loads characterised by a prevalent capacitive component, to which can be added other effects connected with parasitic resistances and inductances.

Among the effectively drivable loads, in the present invention there are the driver terminals (for example gates) of the active switches, such as for example transistors of the following types: BJT, MOSFET, IGBT, HBT, HEMT, MEMS, piezoelectric sensors and actuators, logic gates and apparatus for example but not exclusively of the CMOS, buffer and clock types.

Other loads effectively drivable by means of the present invention are electric motors, solenoids, antennae, transformers and other loads having a prevalently inductive behaviour.

In an aspect of the present invention, the current waveform generator can comprise:
- a generator of direct electric current,
- a switching circuit able to convert the direct electric current into an electric current waveform.

With this solution it is effectively possible to generate a current waveform having a large harmonic content, which can therefore be filtered so as to obtain a wide range of current waveforms suitable for various requirements of the loads to be driven.

In a further aspect of the present invention, the switching circuit can comprise at least:
- an active switch, and
- a driver for generating an electrical driver signal able to switch the active switch on and off.

The active switch can be a transistor, for example a BJT, MOT or IGBT transistor, a solid-state relay, a MEMS switch, and HEMT switch, an HBT switch or another switch.

In some embodiments, the switching circuit might comprise, for example, two active switches in a half-bridge configuration or four active switches in a full H bridge configuration.

In an aspect of the invention, the switching circuit can comprise an inductance connected in series between the direct electric current generator and the active switch, the passive filter having an input terminal connected with an electrical node interposed between the inductance and the active switch.

In this way, the inductance substantially behaves as a generator of approximately direct current which loads during the time in which the active switch is on, while it unloads and powers the load downstream, during the time in which the active switch is off.

In a further aspect of the invention, the switching circuit can also comprise a capacitance connected in series with the inductance and in parallel with the active switch.

The capacitance enables maximising the energy efficiency of the switching circuit, guaranteeing that during the switching on and/or off of the active switch there are not high tensions and currents present on the node that connects the inductance and the active switch.

In a different aspect of the invention, the passive filter can be a resonant reactive filter comprising inductors and capacitors, which can be realised both in the form of discrete elements and in the form of distributed elements, for example transmission lines.

This aspect provides a relatively simple solution for realising passive filters, which, if appropriately configured and tuned, are able to selectively amplify and/or damp one or more harmonics of the electric current waveform received in input.

In this regard, in an aspect of the invention the passive filter can be tuned so as to provide in output a current waveform having a square/rectangular shape or sufficiently alike to a square/rectangular shape.

For example, the passive filter might be tuned for completely or nearly completely damping at least the second harmonic of the electric current waveform in input, more preferably the greatest possible number of even harmonics, and for amplifying the third harmonic with an amplification factor equal to a third of the multiplication factor of the first harmonic, more preferably for amplifying the greatest number of odd harmonics of a higher order than the first with respective amplification factors the relation of which with the amplification factor of the first-order harmonic is equal to the inverse of the order of the corresponding harmonic.

This solution, given by way of example, in practice enables powering the load/s with an electric current waveform that is substantially square, annulling or in any case minimising losses.

This solution is particularly advantageous for driving active switches in switching circuits, with the aim of effectively limiting the dynamic losses in the switches during the steps of switching on/off and off/on.

Entering into more detail, the passive filter might comprise a plurality of electrical modules (i.e. at least two or more than two), each of which comprises at least:
- a first electric branch connected in series with the generator of the current waveform and with the first electric branches of the other modules,
- a second electric branch able to connect the first electric branch with a reference potential (for example earth),
- a capacitance positioned along the second electric branch, and
- an inductance, which can be placed in series with the capacitance along a second electric branch or alternatively on the first electric branch upstream of the second electric branch.

This enables realising a very simple passive filter that is economical and easy to tune for example for realising in output an electric current waveform having a substantially square waveform.

Starting from this basic scheme, each module can then be provided with further reactive components, with the aim of introducing greater degrees of freedom in the filtering which, while having a more complex circuit tuning during the design step, enable providing in output a current waveform that more faithfully responds to the requested form.

In this sense, each electric module might comprise a further capacitance positioned on the first electric branch upstream of the second electric branch. Each module might comprise a first inductance positioned on the first electric branch upstream of the second electric branch and a second inductance arranged in series with the capacitance along the second electric branch. Further, each module might comprise a capacitance connected in parallel to each inductance.

In an aspect of the invention, the electrical load to be driven is connected to an electrical node positioned between the first and the second module of the passive filter.

In this way, in the electric current waveform that reaches the load, the phases of the odd harmonics following the first are automatically in phase with the phase of the first harmonic, which is particularly useful especially for driving the load with square/rectangular waveforms.

In a further aspect of the invention, the drive circuit can further comprise a regulatable reactive load connected in series to the output of the passive filter.

This aspect of the invention confers a double advantage: it enables adapting the behaviour of the passive filter should it be necessary to vary the shape of the electric current waveform and further enables dealing with any eventual variations of the load to be driven, should the load not be constant, so that the switching circuit upstream powers an overall load (load to be driven plus additional reactive load) which has a sufficiently stable and constant impedance.

In general, this aspect enables regulating the drive circuit as a function of the load, so as to guarantee maximum efficiency in all functioning conditions.

In more detail, the regulatable reactive load might comprise a plurality of electric branches (i.e. at least two electric branches or more than two) connected in parallel to one another, each of which connects the output of the passive filter with a reference potential (for example earth) and each of which further comprises at least a reactance and at least a switch connected in series with the reactance.

In this way, by selectively opening or closing the switches the entity of the reactive load can be regulated on the basis of needs.

In a further aspect of the invention, the drive circuit can further comprise:

- an insulating capacitor connected in series between the output of the passive filter and a load to be driven, and
- a second generator of direct electric current connected to a node comprised between the insulating capacitor and the load to be driven.

In this way it is effectively possible to add or subtract to or from the electric current waveform in output from the passive filter an appropriate direct current, which can be used for increasing the power applied to the load to be driven, or also to very simply drive loads that require a negative current, for example HEMT devices based on heterojunctions of type III-V (for example GaN), as it is sufficient to sum an appropriate negative electric current to the wave in output from the filter.

In general, this solution enables an effective decoupling between the voltage and current levels of the current waveform generated in input to the passive filter from those of the current waveform effectively used for driving the electric load.

In an aspect of the invention an inductance can be connected in series between the second generator of direct electric current and the load to be driven.

In this way the wave (normally high frequency) generated by the drive circuit in output from the passive filter can effectively be prevented from negatively interacting with the direct electric current generator.

In a further aspect of the invention, the circuit can further comprise a second insulating capacitor connected in series between a reference potential of the generator of the electric current waveform (in input to the passive filter) and a reference potential of the load.

In this way there is a galvanic decoupling between the passive filter and the driven load, with the consequent possibility of having mass references and separate power supplies for the passive filter and the driven load.

A further embodiment of the present invention relates to a method for driving one or more electrical loads, comprising at least steps of:
- generating an electric current waveform,
- filtering the electric current waveform so as to condition one or more of the harmonics thereof,
- applying the filtered electric current waveform to the electric load.

This embodiment of the invention attains substantially the same advantages as the above-described circuit, in particular the advantage of being able to suitably "shape" the current waveform that drives the electric load/s, so that the most suitable shape can be given to it (in the time domain) for minimising losses and/or for increasing the efficiency and drive effectiveness on the basis of the specific needs of the load/s to be driven.

For example, in the method the filtering step can provide in output a current waveform having a square/rectangular shape or at least sufficiently close to a square/rectangular shape.

All the above aspects of the invention described in the foregoing in relation to the drive circuit are understood to be valid also for the method.

In particular the method can include the generation of the electric current waveform comprising the step of converting a direct electric current in the current waveform, for example by switching on or off an active switch connected to a generator of direct electric current.

The method can further include connecting a regulatable reactive load in series with the passive filter and in parallel with the load to be driven, so as to be able to guarantee maximum efficiency in all the functioning conditions including in a case of variation of the load.

The method can further include the step of adding, to the filtered current waveform, a constant current before applying it to the load to be driven, so as to be able to decouple the voltage and current levels of the current waveform generated in input to the passive filter from those of the current waveform effectively used for driving the electric load.

The method might also include the step of galvanically separating the passive filter from the load to be driven, so as to be able to separate the mass references and the power supply of the passive filter and the driven load.

BRIEF DESCRIPTION OF THE DRAWINGS

Further characteristics and advantages of the invention will emerge from a reading of the following description, provided by way of non-limiting example with the aid of the figures illustrated in the appended tables of drawings.

DETAILED DESCRIPTION

Figure 1:
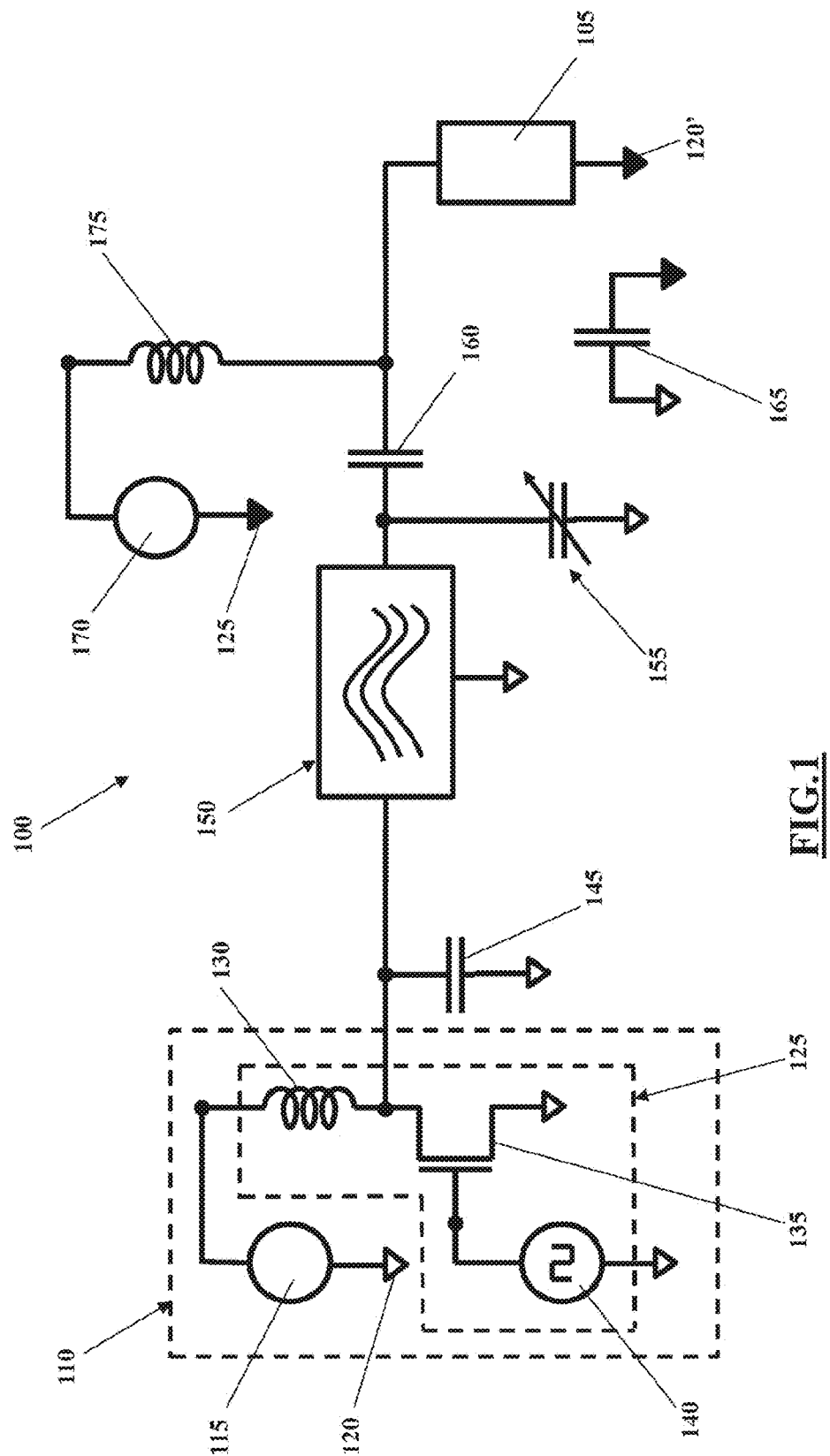
FIGS. 1 and 2 are a general diagram of a drive circuit according to two embodiments of the present invention.

The figures illustrate an electrical circuit 100 configured for driving one or more electric loads 105 with an electric current waveform that is variable over time.

In general terms, the electrical load/s 105 can be substantially of any type, for example resistive loads, capacitive loads or a combination of resistive, capacitive and inductive loads, as will be more fully described in the following.

The driver circuit 100 primarily comprises an electric current waveform generator, which is denoted in its entirety by 110.

In the illustrated example the generator 110 however comprises a direct electric current generator 115 having a first terminal connected to an appropriate reference potential 120, for example earth, and a second terminal connected to a switching circuit, denoted in its entirety by reference numeral 125, which is able to convert the direct electric current generated by the generator 115 into a current waveform, i.e. into a succession of current pulses in which each current pulse varies from a minimum value, for example but not necessarily a substantially nil value, to a maximum value depending on the entity of the direct current in input and on the type of switching circuit 125, as well as the way the circuit 125 is driven.

The direct current generator 115 can be for example a battery but could also be a rectifier, for example a diode bridge rectifier, with a single diode, a double combined diode, a synchronous rectifier or another, which can be connected to an alternating current source, for example a common 230V and 50 Hz electricity distribution network, in such a way as to rectify the alternating current generated by the source. A stabilising filter can be present immediately downstream of the rectifier. In this second case, the generator 115 would be more properly configured as an AC/DC converter.

The switching circuit 125 can comprise an inductance 130, commonly called a choke or feed inductance, which is connected to the second generator terminal 115. In series with the inductance 130, the switching circuit 125 can comprise an active switch 135, for example a BJT, MOS, IGBT transistor, a relay, a solid state relay, a MEMS, HEMT, HBT switch or another switch, which has a first terminal (for example the drain for a type N MOSFET) connected to the output terminal of the inductance 130, a second terminal (for example the source in the case of a type N MOSFET) connected to the reference potential 120 of the generator 115, and a third drive terminal (for example the gate in the case of a FET type transistor or the base in the case of a BJT type transistor) connected to a signal generator or driver 140. The driver 140 is an electric/electronic device 140 which can be referred to the same reference potential 120 as the generator 115, or can be insulated and independent of the reference current 120 and therefore connected by transformers, optocouplers, capacitive insulations, appropriate amplifying stages, etc. and which is able to apply, to the drive terminal of the active switch 135, an appropriate electrical driver signal, for example a square/rectangular waveform having a predetermined duty cycle which is able to switch on (i.e. bring to saturation) and switch off (bring to cut-off) the active switch 135.

A reactance, for example a capacitance 145, can be connected to an intermediate node between the inductance 130 and the active switch 135, the second terminal of which is connected to the same reference potential 120 as the generator 115. In this way, the capacitance 145 is connected in series with the inductance 130 but in parallel to the active switch 135.

Alternatively, the generator 110 might be a conventional generator of alternating current, for example based on the classic linear or switching amplification diagrams, for example based on half-bridges, in which a second switch is substituted for the inductance 130, or complete H bridges.

Figure 2:
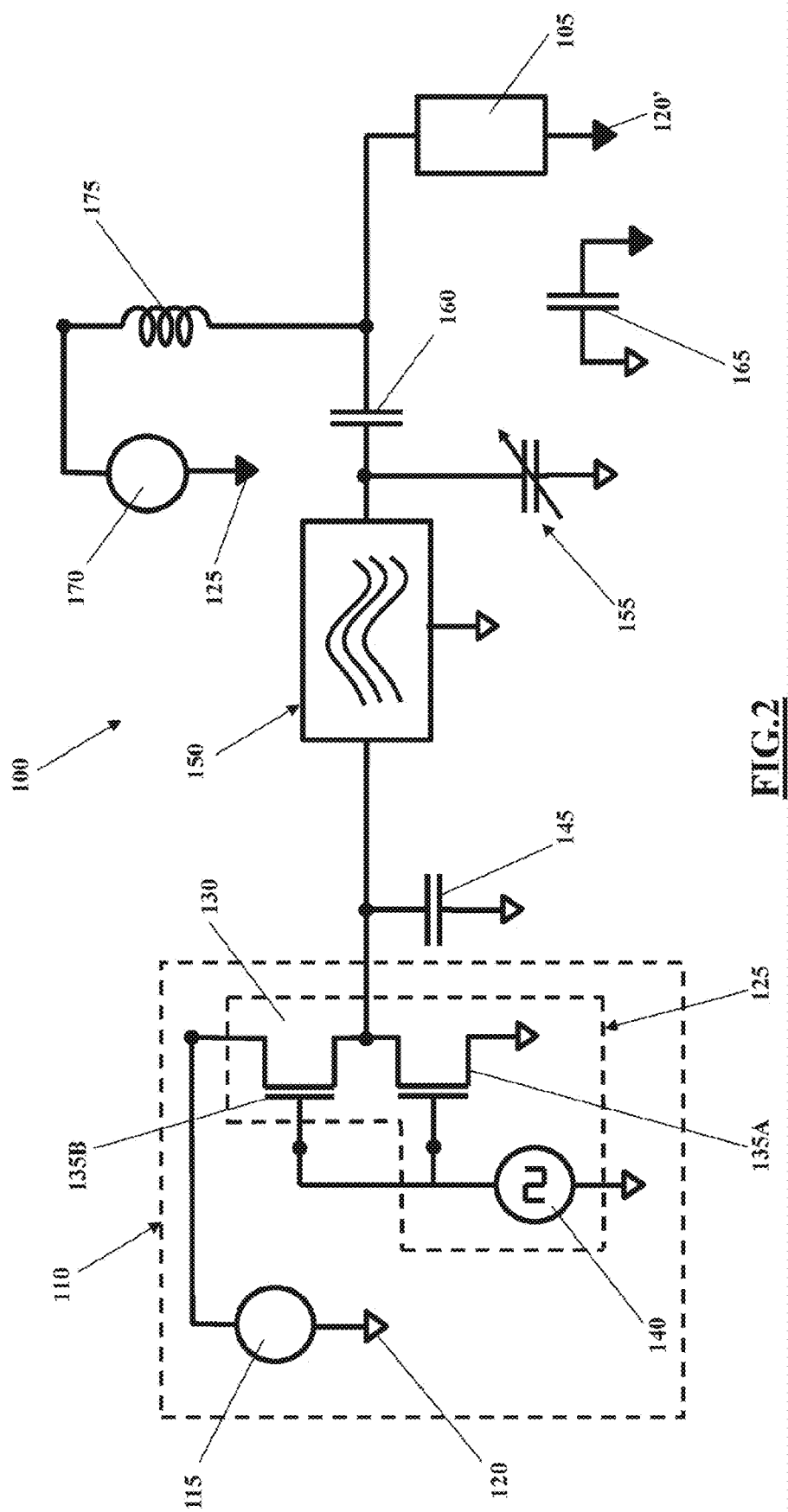

For example, FIG. 2 illustrates a solution in which the switching circuit 125 is made with a half-bridge, comprising two active switches 135A and 135B arranged in series with one another and in series with the direct current generator 115, which active switches are driven by the driver 140 in such a way as to switch on and off alternatingly, i.e. when switch 135A is one, switch 135B is off, and vice versa.

In this case too the output node of the generator 110 and the intermediate node between the active switches 135A and 135B, to which the capacitance 145 can also be connected, as explained in the foregoing.

The drive circuit 100 further comprises a passive filter, denoted in its entirety by 150, which comprises an input terminal connected to the intermediate node to which the inductance 130 and the active switch 135 (or the two active switches 135A and 135B) are connected, and an output terminal connected in series to the load 105 to be driven. The passive filter 150 can also have a third terminal connected to the same reference potential 120 of the generator 115.

The passive filter 150 generally comprises reactive, capacitive and inductive components, and can possibly also comprise resistive elements.

A variable capacitance or another appropriate reactive load 155 that is regulatable under control, can be connected to the passive filter 150, which passive filter 150 has a second terminal connected to the same reference potential 120 as the generator 115.

The drive circuit 100 can further comprise an insulating capacitor 160 connected in series between the output of the passive filter 150 and a load 105 to be driven. In this way, the insulating capacitor 160 subdivides the drive circuit 100 into a primary circuit (upstream of the capacitor 160), which can create an appropriate current waveform, and a secondary circuit (downstream of the capacitor 160), which is galvanically isolated from the first capacitor and is able to transfer the current waveform to the load 105.

In this regard, there can also be a second insulating capacitor 165 present, useful for completely decoupling the primary circuit from the secondary circuit, enabling for example the load to be driven 105 to be referred to a reference potential 120' that is different from the reference potential 120 of the generator 115. This is particularly useful for example when, on the power circuit, there are high current or voltage values and it is desired to conserve the logic part which is typically particularly sensitive to overtensions.

If present, the second insulating capacitor 165 will therefore have a first terminal connected to the reference potential 120 of the generator 115, and a second terminal connected to the reference potential 120' of the load 105. Should on the other hand the second insulating capacitor 165 not be present, it is clear that the reference potential of the load 105 would have to coincide with the potential of the generator 115.

In any case, the insulating capacitor/s 160/165 can be sufficiently large so as not to significantly alter the waveform with which the load 105 is driven, enabling however a summing of the electric current waveform generated in output from the passive filter 150 to the independent current present on the secondary circuit.

Alternatively the insulating capacitor/s 160/165 can be of such dimensions as to interact significantly with the rest of the reactive circuit. A dimension of this type can be particularly useful for example for minimising the volumes of the circuit for a given performance The secondary circuit of the drive circuit 100 can comprise a second direct current generator 170 having a first terminal connected to the reference potential 120' of the load 105 to be driven, and a second terminal connected to an electrical node comprised between the insulating capacitor 160 and the load 105.

In this way, the generator 170 can be useful for summing or subtracting an appropriate direct current to the current generated by the primary circuit downstream of the passive filter 150.

To prevent the primary circuit of the drive circuit 100, typically operating in a high-frequency regime, from interacting with the generator 170, it might be useful to include an inductor 175 connected in series between the generator 170 and the load 105, and more precisely, between the generator 170 and the node comprised between the insulating capacitor 160 and the load 105. This inductor 175 can be sufficiently large to block all the high-frequency waves coming from the passive filter 150.

Functioning

The system constituted by the inductance 130 and the active switch 135 driven by the driver 140 operates in switching mode, creating in the time domain an electric current waveform which crosses the passive filter 150.

In fact, during the time in which the arrival switch 135 is switched on, the inductance 130 loads, while during the time in which the active switch 135 is switched off, the inductance 130 unloads onto the passive filter 150. The inductance 130 therefore behaves in first approximation as a current generator, with a ripple that is a function of the dimensioning of the inductance 130. It is stressed how useful it can be to minimise the dimensioning of the inductance 130, making it an integral part of the overall resonant system, with the aim for example of minimising the volumes of the system, or with the aim of increasing the section of the conductor constituting the inductance 130, therefore reducing the parasitic losses and increasing the energy efficiency of the system.

The capacitance 145 located in parallel with the active switch 135 enables maximising the energy efficiency of the switching circuit 125, guaranteeing that during the switching on and/or off of the active switch 135 there are not high tensions and currents present on the node on the same time that connects the inductance 130 and the active switch 135. At high frequencies, it is possible for the capacitance 145 not to be physically present, but for the parasitic capacitance of the switch 135 to be used for the same purpose, as it often has the same order of magnitude as the capacitances necessary for a correct tuning of the circuit.

The current waveform generated by the switching circuit 125 is then appropriately modified/conditioned by the passive filter 150, so that the load 105 is powered with a current waveform having a predetermined waveform in the time domain.

In particular, the passive filter 150 can be a resonant reactive filter, comprising appropriately connected inductors and capacitors, which is able to amplify appropriate harmonics of the current waveform received in input and damp others, all as a function of the waveform with which the load 105 is to be supplied.

In other words, according to the waveform produced by the switching circuit 125, the passive filter 150 can be tuned so as to provide in output a filtered current waveform having a predetermined form and corresponding to the one which is to drive the load 105.

For example, should it be desired to drive the load 105 with a square/rectangular wave, the passive filter 150 will be tuned so as to amplify the fundamental frequency of the signal, and all or many odd harmonics, with an amplifying factor of the 3rd harmonic equal to ⅓ of the amplification of the fundamental, an amplifying factor of the 5th harmonic equal to ⅕ of the fundamental, and so on, and in such a way as to contemporaneously completely or nearly completely absorb all or many equal harmonics.

The greater the number of harmonics appropriately conditioned by the filter 150, the better will be the similarity of the output wave with the desired wave, for example a square wave.

Clearly, by modifying the desired signal on the output it will be necessary to modify the tuning of the passive filter 150 consequently, specifically by tuning the filter 150 so as to amplify or damp the input signal, so as to reproduce as faithfully as possible the spectral content of the current waveform desired in output.

In any case, the tuning of the reactive components of the passive filter 150 can be realised in the Zero Current Switching (ZCS) mode or in the Zero Voltage Switching (ZVS) mode, even if it is easier and more convenient for the aims of the present invention to operate in Zero Voltage Switching (ZVS) mode, and therefore with nil voltage during the step of switching the switch on/off.

In this context, the regulatable reactive load 155 can absolve two possible functions. The first function is relative to the possibility of adapting the passive filter 150 should it be necessary to vary the drive waveform of the load 105 (for example if the desired duty cycle is modified or more in general the desired waveform). The second function of the regulatable reactive load 155 consists in the possibility of compensating eventual variations of the load 105, should it not be constant, so that the passive filter 150 is called to power a load that has a sufficiently stable and constant impedance.

In overall terms, the drive circuit 100 can be seen as a resonant soft switching amplifier, selectively with respect to the harmonics of interest, with a gain for each harmonic that is appropriately calibrated for obtaining the desired waveform, and as a soft switching damper for the non-desired harmonics on the load 105. Note that also with respect to the undesired harmonics the drive circuit 100 has a high efficiency, since the passive filter 150 behaves as a reactive short circuit, and therefore able to completely absorb the undesired harmonics without dissipating energy and therefore maintaining the high efficiency.

The drive circuit 100 is distinguished by other amplifiers, such as resonating amplifiers in class D, E, F, E/F, $E^{-1}$, $F^{-1}$ or other like circuits, since the passive filter 150 feeds the load 105 with more harmonics with respect to the fundamental, each appropriately amplified or damped, precisely so as to obtain on the load wave forms that are different to the simple sinusoidal, which instead constitutes a particular case of the present circuit that is well known as easy and immediate to implement.

In particular, the passive filter 150 supplies the load 105 to be driven with the harmonics appropriately amplified or damped useful for constructing the desired drive single, guaranteeing at the same time an energy efficiency that can reach theoretical 100% and which can be translated into a real efficiency of more than 90%.

In the following sections further clarification will be provided in relation to the various components of the drive circuit 100.

Load to be Driven

Figure 3:
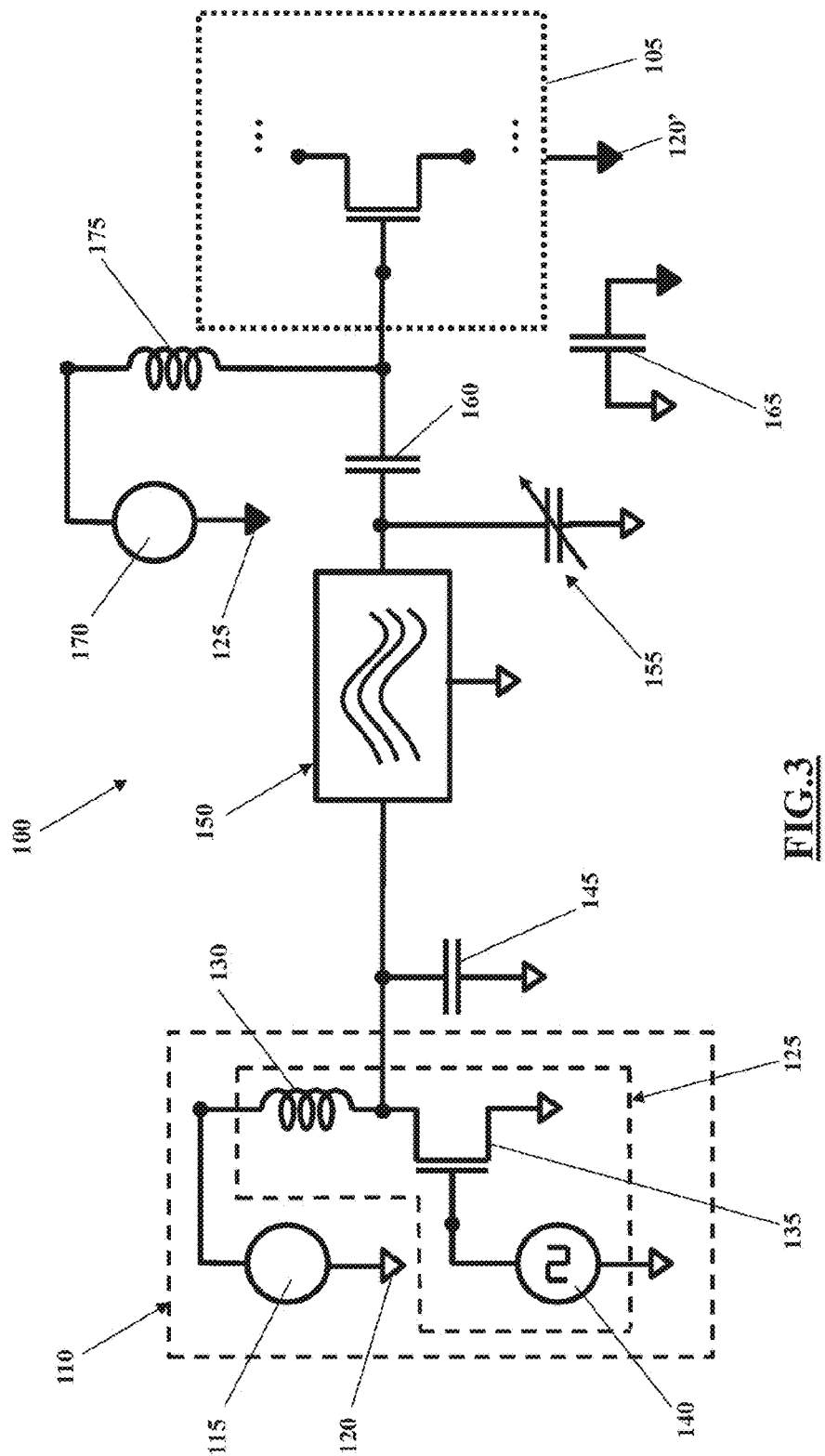
FIG. 3 is the diagram of FIG. 1 in which a possible electrical load to be driven is illustrated.

With reference to FIG. 3, the load to be driven 105 can be an active switch, for example the drive terminal of a BJT, MOSFET, IGBT, HEMT, HBT transistor, a piezoelectric load (for example piezoelectric sensors or actuators) or another load characterised by having a preponderant and/or significant capacitive component.

In particular, the electric load might be the drive terminal of an MOS transistor to be driven with a high-frequency signal, for example with a signal having a fundamental frequency of MHz, tens or hundreds of MHz, or even GHz for RF type systems, or the drive terminal of a FET of an HEMT type (for example GaN) to be driven with frequencies that might reach tens of MHz or GHz, or the gates of logic gates to be driven at higher than GHz frequencies. In this context, the drive circuit 100 described above enables significantly reducing the losses and increasing the switching frequency without incurring significant problematics. The drive circuit 100 can therefore be effectively used for driving the drive terminals of high-frequency power switches and with low losses.

For example, the drive circuit 100 can be particularly useful for effectively driving MOSFETs based on binary semiconductors such as SiCs, characterised by high threshold currents (even above 15V) and therefore up to now very much penalised with respect to silicon-based semiconductors.

In fact the drive circuit 100 enables driving the MOS with square waves having a great amplitude, shorter rise and fall times of the fronts and lower peak current with respect to the RMS value, guaranteeing at the same time very low consumptions and very high switching frequencies.

In other embodiments, the load to be driven 105 can comprise a multitude of drive terminals of a same number of transistors, such as in the case of a synchronising clock of all the logic gates constituting the modern microswitch or microprocessor calculating systems, including the memories, graphic cards, as well as any device today realised in CMOS technology, in which a clock provided with appropriate buffers for improving the fan-out must load and unload the logic gates of each logic components.

In all these cases the load is substantially capacitive and at each driving cycle (for example each clock cycle) it is necessary to load and unload the capacitance of each single transistor by means of appropriate driving. By executing this drive by means of the above-mentioned drive circuit 100 it is advantageously possible to annul or in any case significantly reduce the dissipation of energy normally connected with the load and unload cycles.

In fact, the system constituted by the active switch 135 and the assembly of the passive filter 150 and the further reactances 130, 145, 155 and by the load reactance 105 constitute a resonating system with more than one frequency, tuned so as to function in ZCS and/or ZVS mode on all the frequencies of interest and therefore able to eliminate the losses linked to the continuous load and unload cycles of the load 105. Once the whole resonant circuit is loaded, in substance, there is a continuous leap of the energy of each harmonic from the drive circuit to the load as regards the desired harmonics, and among reactive components of the drive circuit as regards the undesired harmonics on the load, without it being necessary to supply the circuit with further energy except for the energy lost on the resistive parasitic elements. Clearly the filter 150 must be designed not only so as to guarantee that the amplitude of each harmonic is the desired one but, as regards the harmonics that must arrive at the load 105, even to guarantee that the phase of the harmonics is delayed or anticipated appropriately with respect to the phase of the fundamental, so as to guarantee on the load 105 the overall desired wave form.

This type of non-dissipating functioning, together with the soft switching driving of the active switch 135 enables a very high energy saving and very high frequencies of functioning.

Likewise, the drive circuit 100 can be used for generating a clock able to synchronise a high number of logic gates (high fan-out) and substantially zero the losses and consequently reduce the needs of buffering systems useful for regenerating the clock signal beyond a certain number of connected logic gates, significantly reducing the power lost. Therefore a modern computer, a smartphone, a tablet, or any other electronic device having a clock, in which nowadays the capacitive load is loaded and unloaded millions of times a second, the capacitive load being constituted by the totality of the gates, constituting the logic gates of the system, can be improved by using the drive circuit 100 as a clock, with the aim to zero this type of loss.

In this case the regulatable reactive load 155 can be used effectively to balance the normal variability of the number of logic gates that are active in a given moment, so that overall the clock generation system sees a capacitive load that is substantially constant and independent of the logic gates active in a given moment.

Should it be necessary to insulate the drive circuit 100 from the load 105 and/or modify the direct current for polarising the load 105, it is possible to add, in series at the output of the passive filter 150, the insulating capacitors 160 and 165 and the inductance 175, dimensioned with sufficiently large values for guaranteeing passage of the drive harmonics through the capacitances 160 and 165 and for blocking the passage of the harmonics towards the generator 170 via the inductance 175.

This diagram enables for example adding or removing an appropriate direct current offset to the wave generated by the passive filter 150 upstream, and it is also useful for galvanically decoupling the drive circuit from the load.

This diagram is particularly advantageous for example for compensating on/off thresholds linked to the specific switch, and for guaranteeing a simple "enable" system of the power stage, as well as for preventing high currents present on the load from damaging sensitive components on the drive circuit. For example, a negative offset can be used in this drive circuit so as to be able to use, in switching mode, switches base on HEMT, for example of the GaN type, or other heterojunctions, typically characterised by a normally ON channel and by the need for negative currents to be sent to cut-off.

Therefore the proposed system enables realising an efficient driver or clock system not only for logic switches or gates based on silicon semiconductors, but also on binary or ternary semiconductors such as for example SiC, GaN, GaAs, AlGaN, AlGaAs, InGaN, InGaP, etc.

It is however worthy of note that the drive circuit 100 can be effectively used for supplying any type of load, even a non-capacitive one, for example inductive or resistive, such as for example electric motors, solenoids, antennae, transformers etc.

In all cases (capacitive, inductive or resistive load) the drive circuit 100 can be tuned including in the tuning the impedance value of the load 105 or considering the load 105 insignificant with respect to the fictional load constituted by the capacitance 145, the passive filter 150 and the regulatable reactive load 155.

Regulatable Reactive Load

Figure 4:
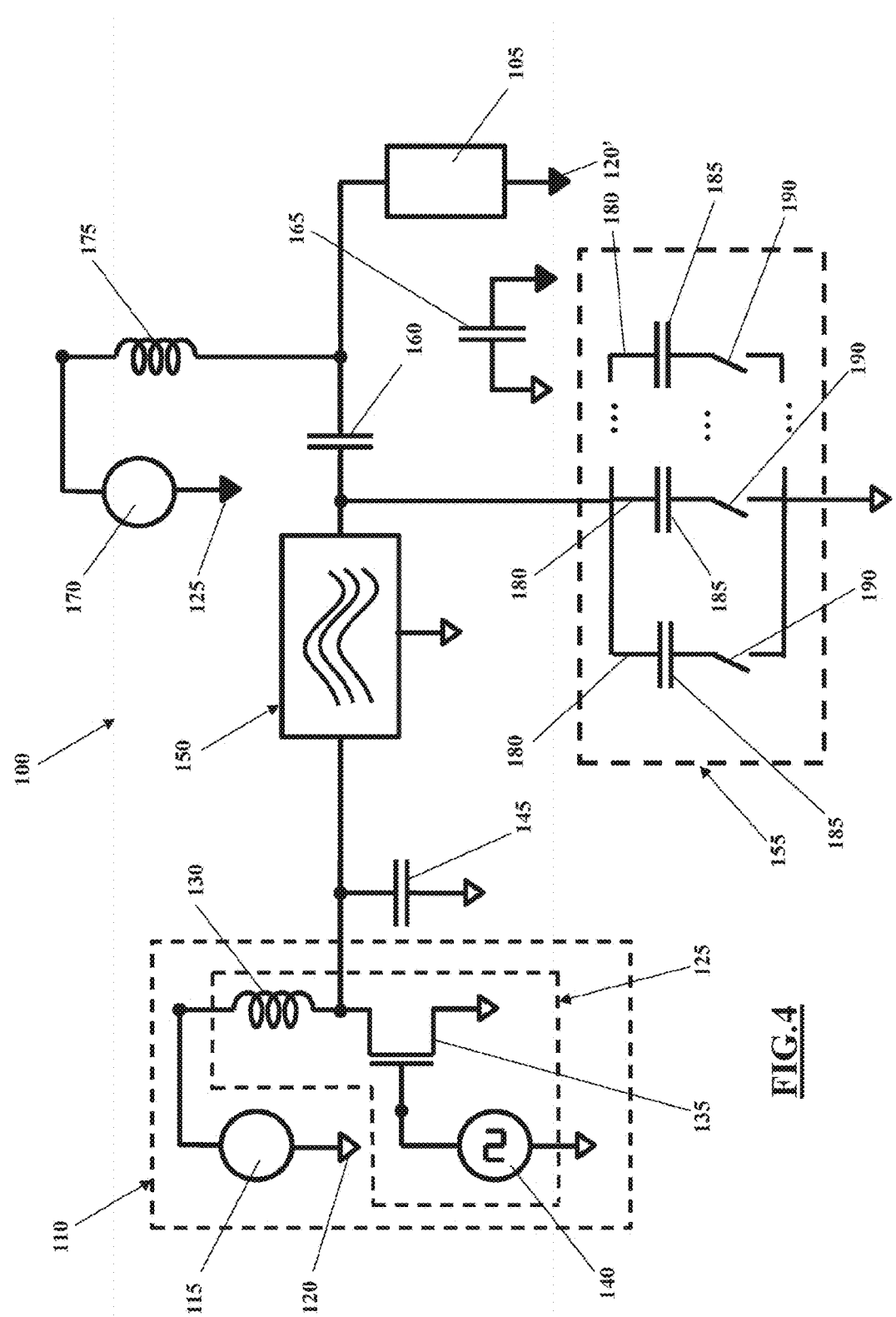
FIGS. 4 to 6 are the diagram of FIG. 1, wherein possible embodiments of the regulatable reactive load are illustrated.

With reference to FIG. 4, the regulatable reactive load 155 can comprise a plurality of electric branches 180 connected to one another in parallel, each of which has a first terminal connected to the output of the passive filter 150 upstream of the insulating capacitor 160 (if present), and a second terminal connected to the reference potential 120 of the generator 115. A respective reactance is inserted along each of the electric branches 180, for example a capacitance, and a respective switch 190 positioned in series between the reactance 185 and the reference potential.

The switches 190 can be active switches, for example MOSFET, BJT, relays, solid state relays, possibly in CMOS, MEMS, technology or any other type of switch.

In this way, by switching on one or more of the switches 190, the respective reactances 185 are in parallel with the load 105. Vice versa, should the switches 190 be switched off, the respective reactances 185 are floating and therefore do not modify the total impedance constituted by the sum of the reactances 185 which are headed at the switched-on switches 190, the reactance of the load 105 and the reactances of the passive filter 150. Therefore, by appropriately varying the number of the switched-on and switched-off switches 190, an overall regulation of the total impedance is obtained.

It is stressed that the switches 190 can be driven completely independently with respect to the signal, typically high-frequency, which drives the switch 135.

It is further desired to stress that the regulatable reactive load 155 might comprise even one only of the electric branches 180, with the relative reactance 185 and the relative switch 190, or might comprise any other regulatable reactance, for example one or more variable capacitances.

Figure 5:
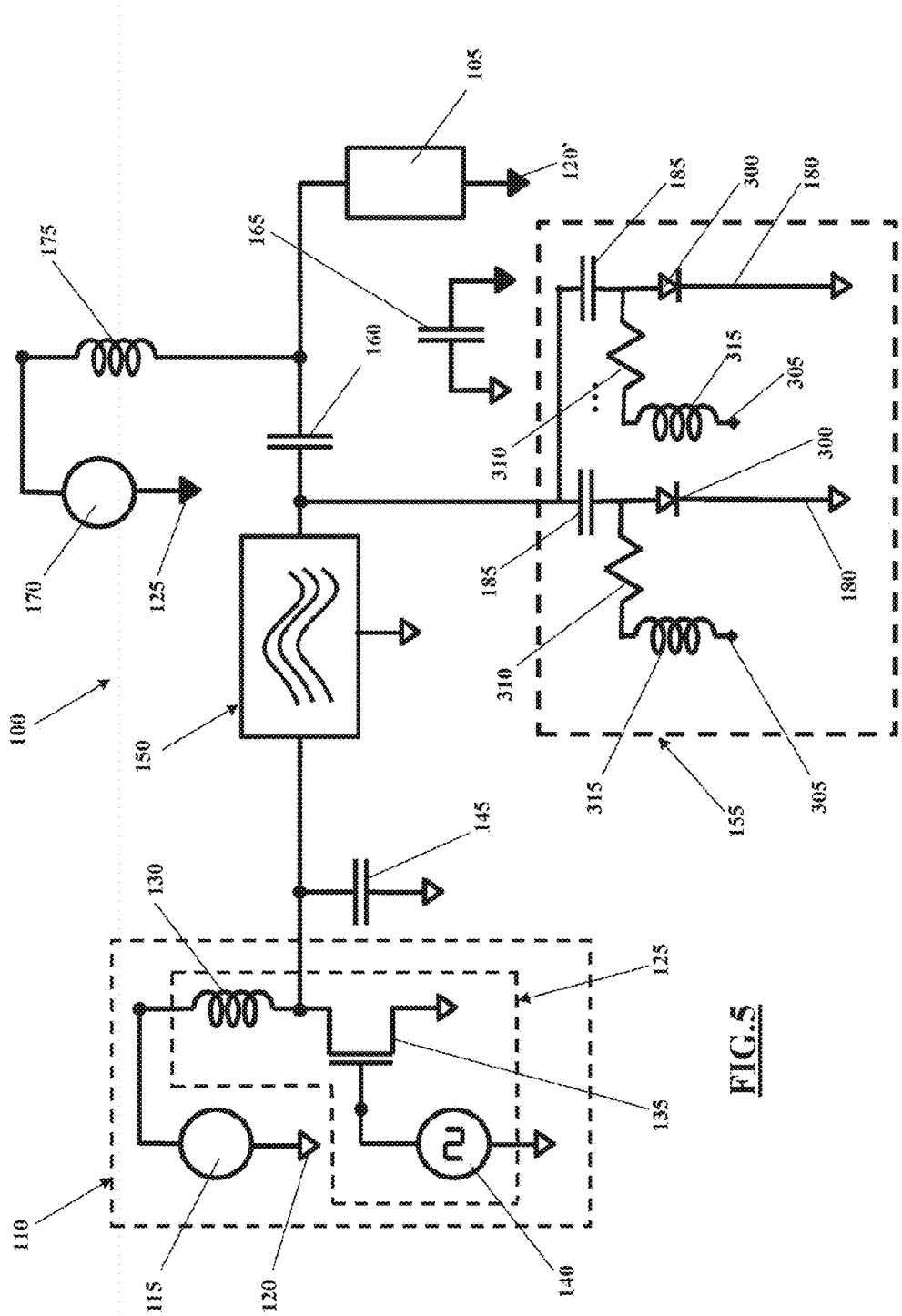

For example, an alternative might be the one illustrated in FIG. 5, in which each switch 190 of the regulatable reactive load 155, for example the above-mentioned MOSFETs or BJTs useful for including/excluding the reactances of the regulatable load, is replaced by a diode 300 in series to the reactance 185, for example the capacitance, and by an electric branch 305 connected to a node of the branch 180 comprised between the reactance 185 and the diode 300.

With the electric branch 305 it is possible to apply an appropriate digital signal in this intermediate node.

In this way, if the digital signal is brought to a sufficiently low current, the diode 300 is cut-off and the reactance 185, for example the capacitance, is excluded from the reactive circuit, vice versa if the digital signal is brought to a sufficiently high current, then the diode 300 is brought into conduction and therefore the compensation reactance intervenes in the overall resonance of the system.

A resistance 310 and an inductance 315 can be arranged in series on the electric branch 305, in which the resistance 310 limits the polarising current of the diode 300 while the inductance 315 prevents the high-frequency signals from interacting with the digital polarising signal of the diode 300.

By using a multiplicity of these circuits in parallel it is therefore possible to realise a variable reactance as a function of the digital drive signals, able to compensate the load or waveform variations of the main circuit.

Figure 6:
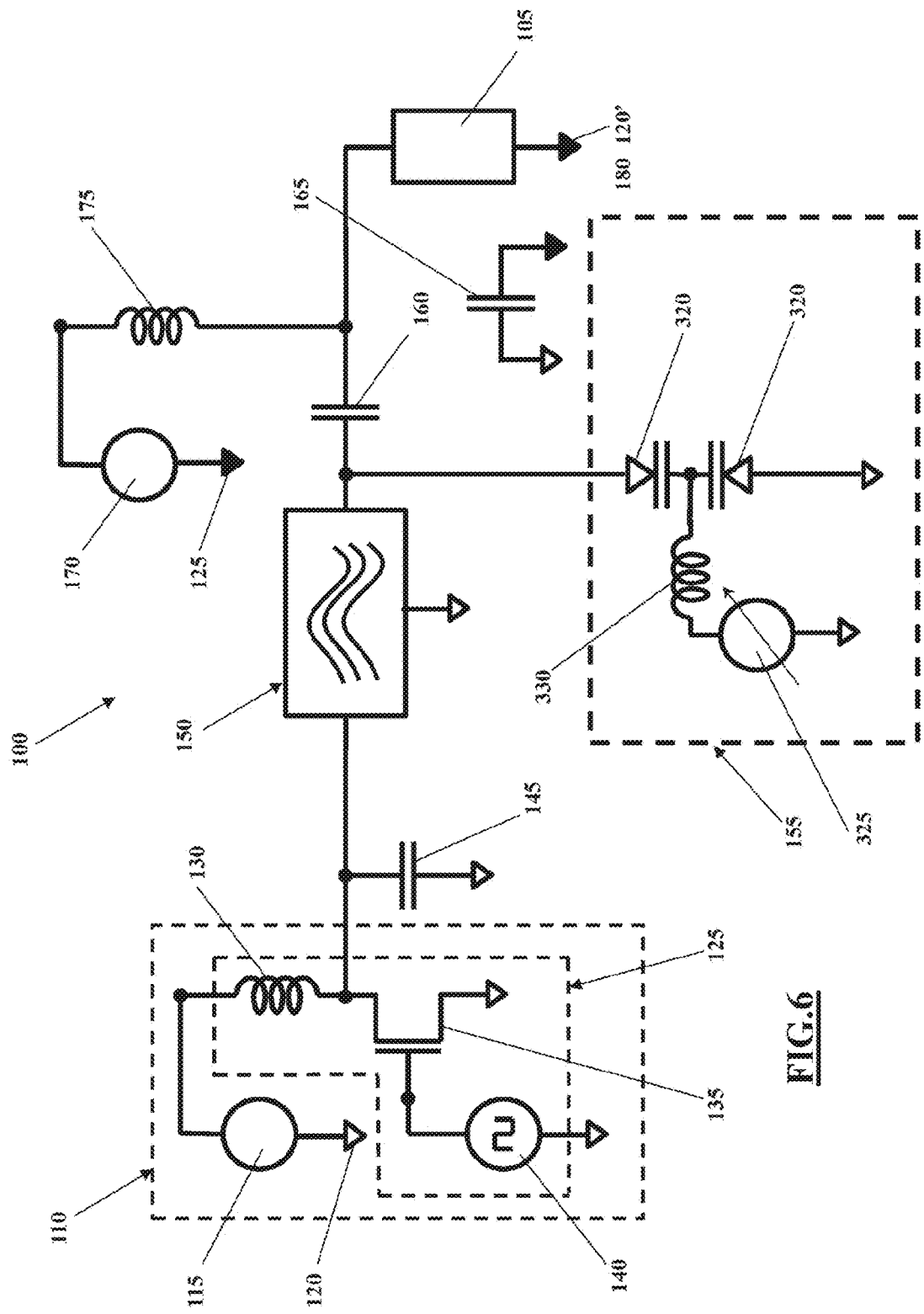

A further alternative is illustrated in FIG. 6, in which the regulatable reactive load 155 is realised by means of diodes of the varicap type, having a high parasitic capacity that is a function of the current applied to the varicap diode. For example, the regulatable reactive load 155 can comprise two varicap diodes 320 connected in series, and in particular by connecting the respective cathodes together, and a direct current generator 325, which is able to apply a regulatable tuning current to the cathodes of the varicap diodes 320.

In this case too, in order to prevent the generator 325 from interacting with the high-frequency signals, an inductance 330 can be inserted in series between the generator 325 and the connecting point of the two cathodes of the varicap 320.

In this way, the reactive circuit substantially has a variable capacitance that is a function of the DC current applied to the cathodes of the varicap diodes 320.

Passive Filter

As explained in the foregoing, the passive filter 150 has the aim of appropriately amplifying determined harmonics of the current waveform generated by the switching circuit 125 and damping others. To do this, the passive filter 150 is preferably a multi-resonant system, with appropriate reactances of a capacitive and inductive type placed in series and parallel and dimensioned so as to obtain the correct level of amplification/damping of each harmonic with respect to the fundamental frequency, useful for producing the desired signal in output for driving the load 105.

Figure 7:
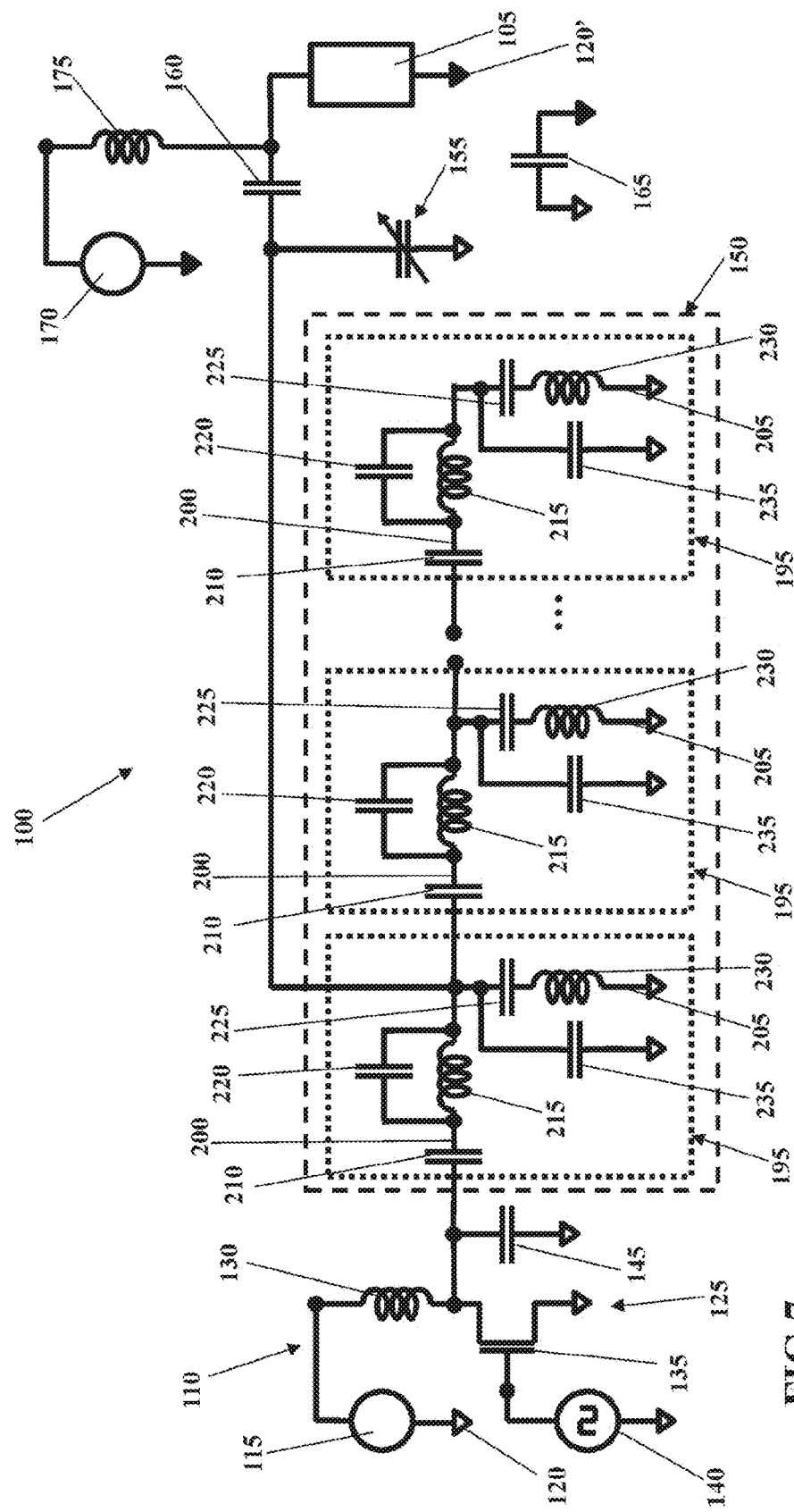
FIGS. 7 to 12 are the diagram of FIG. 1, wherein six possible embodiments of the passive filter are illustrated.

In this regard, the passive filter 150 can be realised by composing a series of modules 195 (i.e. at least two modules) connected to one another as illustrated for example in FIG. 7.

Each module 195 can comprise a first electric branch 200 connected in series with the first electric branches 200 of the other modules 195 and with the generator 110 of the current waveform, in the example with the electrical node comprised between the inductance 130 and the active switch 135.

Each module 195 can further comprise a second electric branch 205 connected to the output terminal of the respective first electric branch 200 and able to connect the first electric branch 200 with the reference potential 120 of the generator 115, for example the earth.

According to the embodiment illustrated in FIG. 7, an input capacitance 210 can be present on the first electric branch 200 of each module 195, followed by a parallel LC resonant circuit comprising an inductance 215 placed in parallel with a capacitance 220. At the same time, an LC resonant circuit can be present on the second electric branch 205 of each module 195, comprising a capacitance 225 followed by an inductance 230. Each module 195 can also possibly comprise a further capacitance 235 placed in parallel with the serial LC resonant circuit.

The output node of each module 195, which can be connected to a following module 195 and/or the load to be driven 105, is constituted by the node in common between the first electric branch 200 and the second electric branch 205, in the example of FIG. 4 between the parallel resonator and the serial resonator.

It is stressed that there are various possible circuit implementations and topologies for realising the passive filter 150, all appropriately dimensionable for attaining the desired aim of amplification of some harmonics and damping of others with respect to a fundamental frequency.

For example, the modules 195 previously illustrated can be appropriately simplified while still guaranteeing degrees of freedom to the system, useful for satisfying the constraints on the amplifying relations among the various harmonics and for constructing the desired waveform for powering the load 105.

Figure 8:
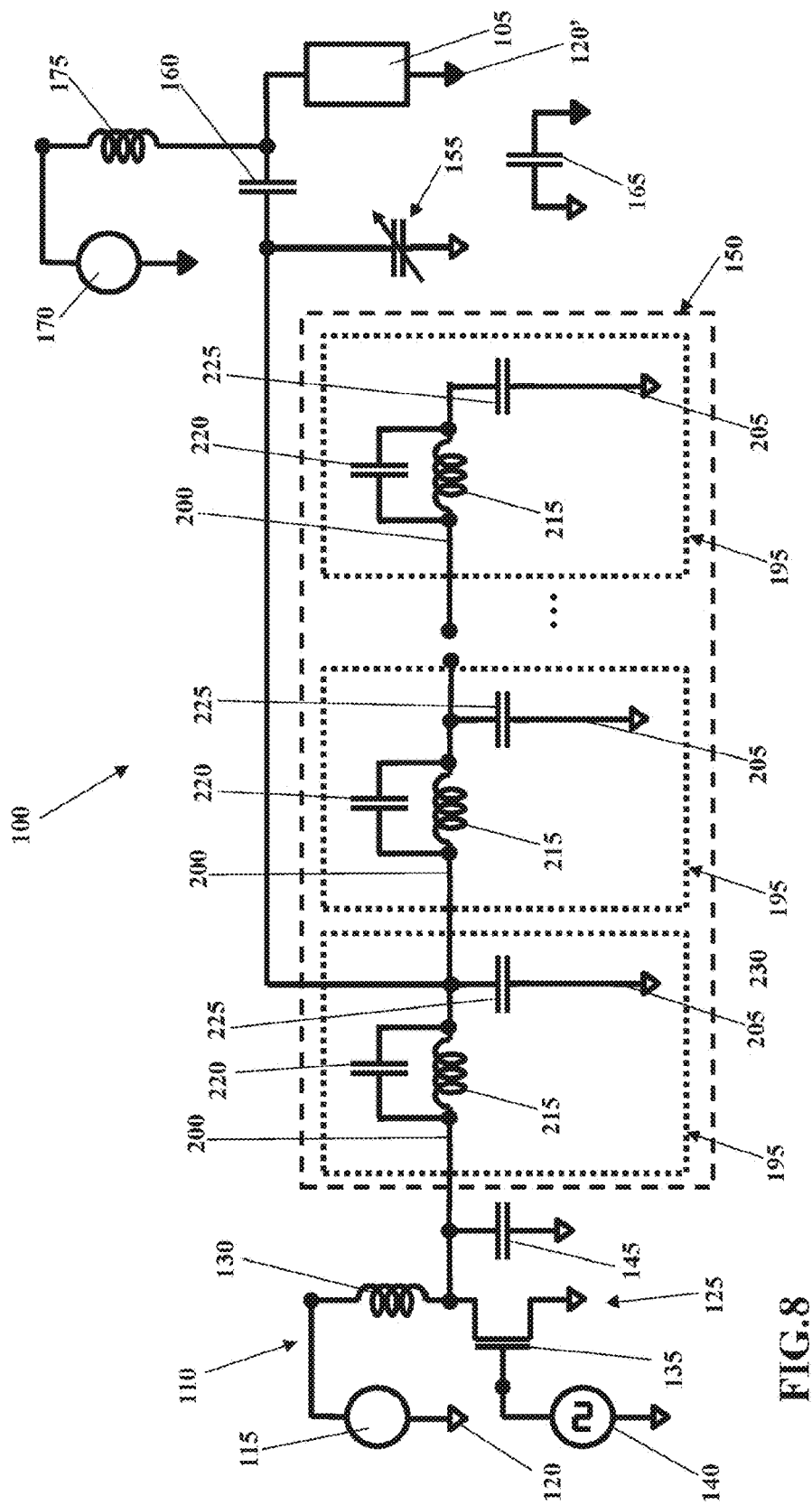

According to the embodiment illustrated in FIG. 8, only the parallel LC resonant circuit is inserted on the first electric branch 200 of each module 195, comprising the inductance 215 placed in parallel to the capacitance 220, while only the capacitance 225 is inserted on the second electric branch 205 of each module 195.

Figure 9:
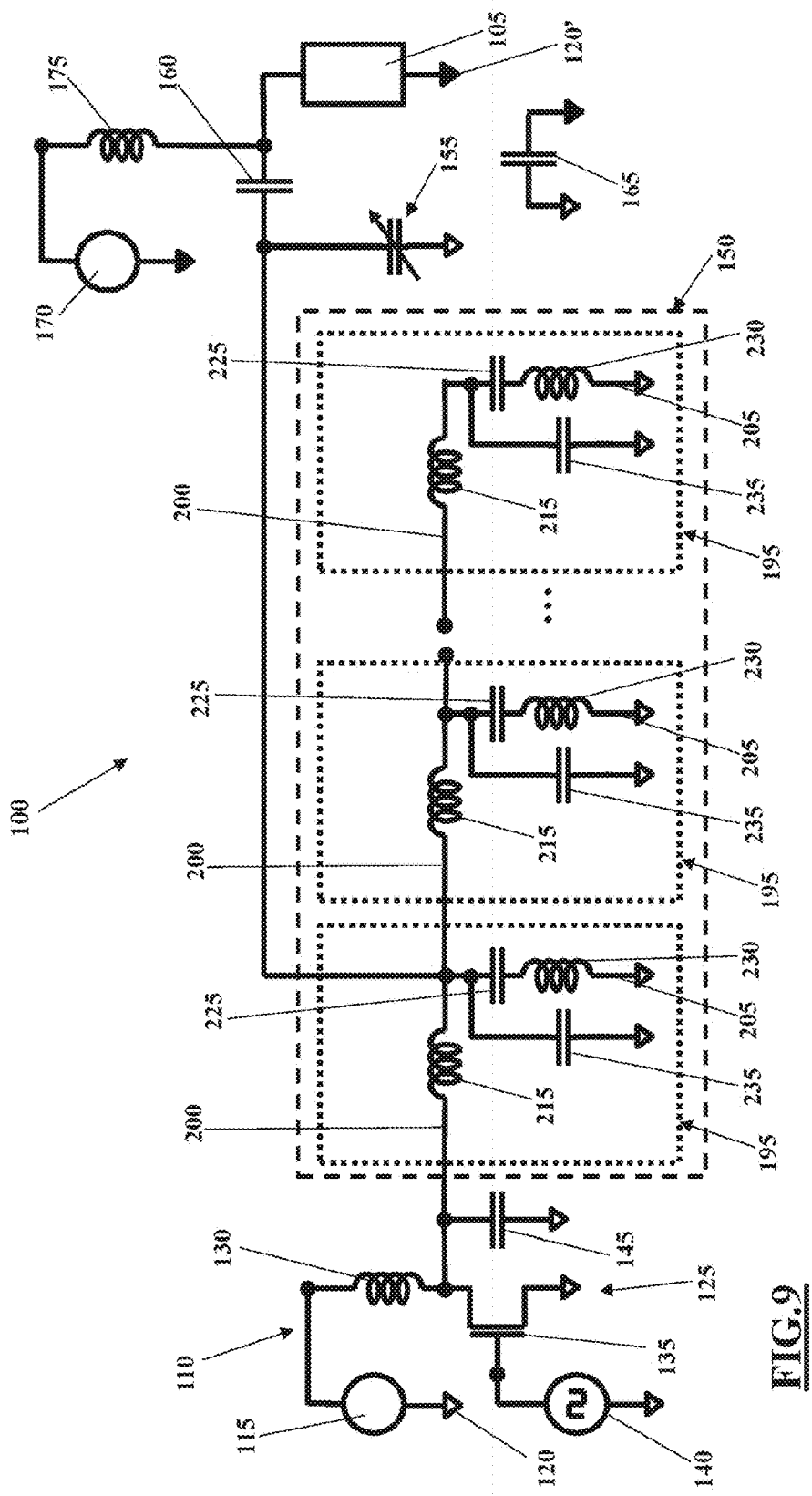

According to the embodiment illustrated in FIG. 9, only the inductance 215 is inserted on the first electric branch 200 of each module 195, while the capacitance 235 is inserted on the second electric branch 205 of each module 195 in parallel with the series LC resonant circuit 225 comprising the capacitance followed by the inductance 230.

Figure 10:
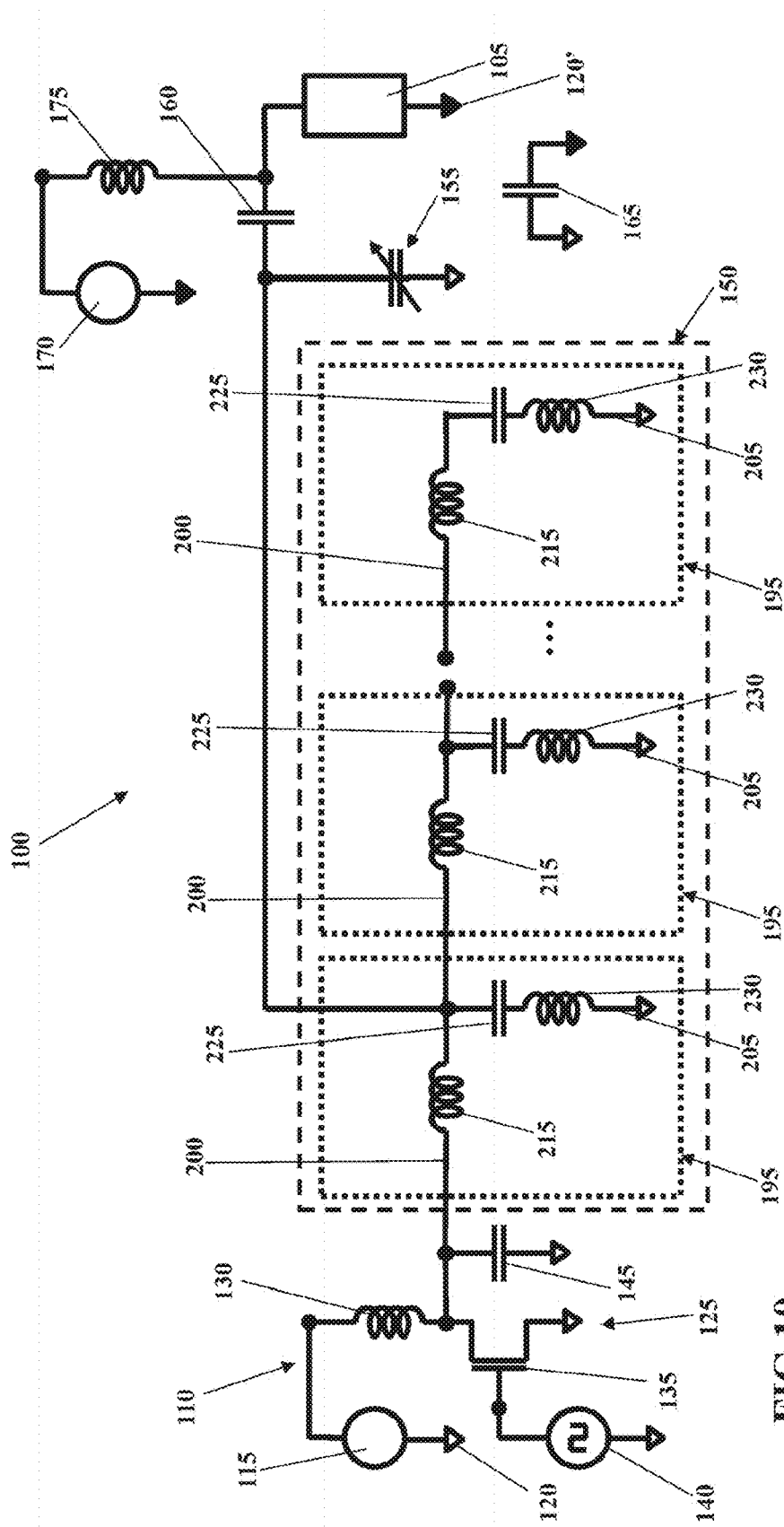

According to the embodiment illustrated in FIG. 10, only the inductance 215 is inserted on the first electric branch 200 of each module 195, while only the series LC resonant circuit is inserted on the second electric branch 205 of each module 195 comprising the capacitance 225 followed by the inductance 230.

Figure 11:
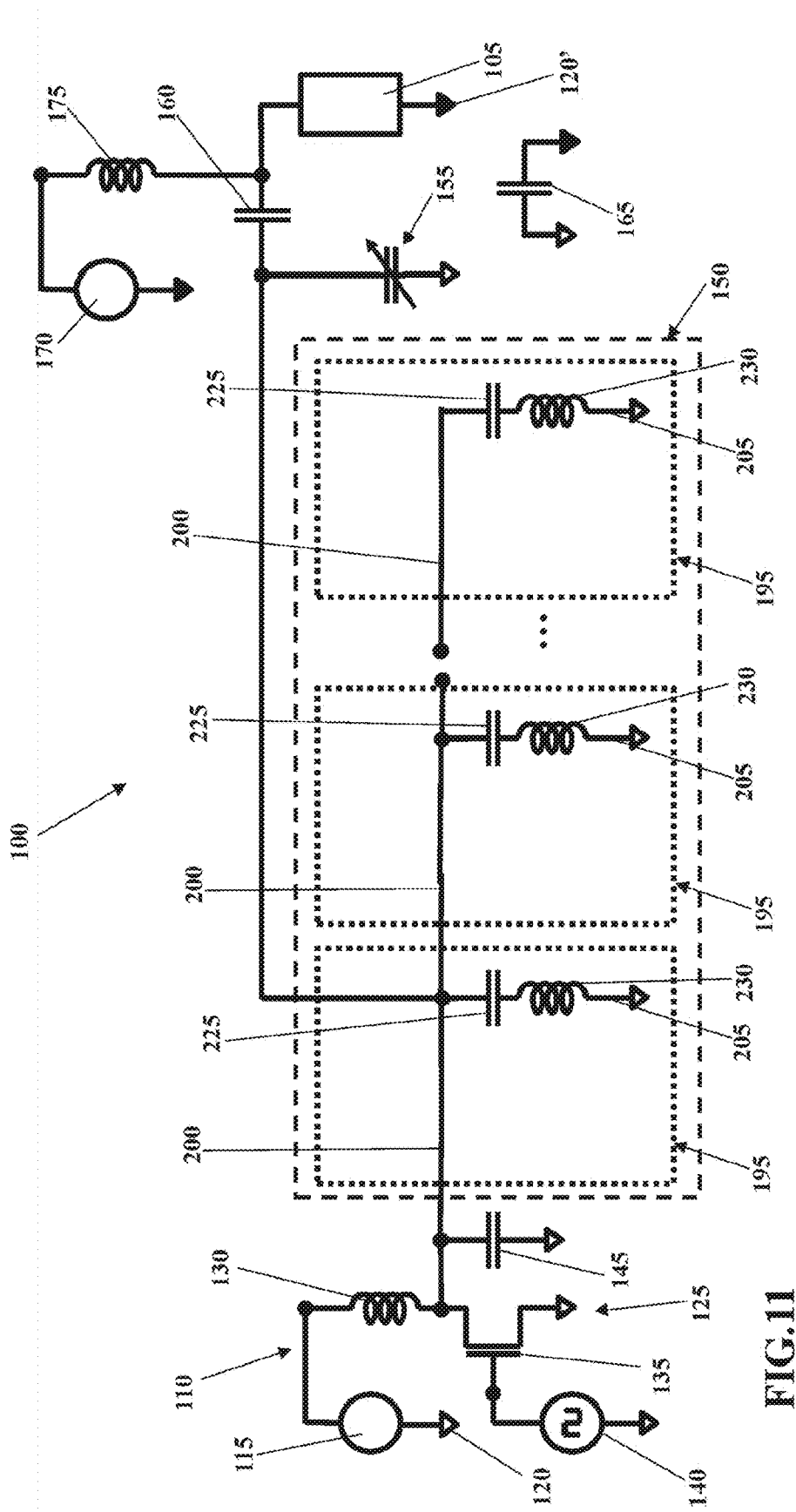

According to the embodiment illustrated in FIG. 11, no reactive component is inserted on the first electric branch 200 of each module 195, while only the series LC resonant circuit is inserted on the second electric branch 205 of each module 195 comprising the capacitance 225 followed by the inductance 230.

In all the above-mentioned cases, the load to be driven 105 can be connected to the output node of any one of the modules 195. Specifically, the load to be driven 105 can be connected to the output node of a module 195 chosen to enable each harmonic to arrive on the load 105 with the correct phase with respect to others in order to construct the desired drive signal.

For example, in a case where the electric load 105 is to be driven with square waveforms (obtained by amplifying the fundamental frequency of the waveform in input and the odd harmonics thereof and damping the equal harmonics), the load 105 can be advantageously connected to the output node of the first module 195, i.e. between the first and the second module, so that the odd harmonics are automatically all in phase with respect to the fundamental frequency.

Whatever the preselected diagram, it is further preferable that the passive filter 150 has, overall, low parasitic values for maintaining the energy efficiency of the drive circuit 100 high. For this purpose it is for example possible to use ceramic capacitors provided with low ESR (Equivalent Series Resistance) and low self-discharge, as well as inductors with low losses in the magnetise material (for example ferrites suitable for the high frequencies in play or indeed enveloped in air or on non-ferromagnetic material. This is possible especially by virtue of the high frequencies in play, which enable miniaturisation of the components, for example with capacitances in the order of pF, tens of pF, hundreds of pF or at most a few pF, and inductors with values in the order of a few nH up to a maximum of a few uH.

All the proposed variants enable, if properly dimensioned and tuned, transferring the desired waveform onto the load to be driven 105, with a high degree of efficiency (ideally no loss) and a very high drive frequency of the load, with the possibility of contemporaneously carrying out a galvanic separation of the load 105 from the drive circuit 100 and a shifting level of the DC value applied to the load.

Figure 12:
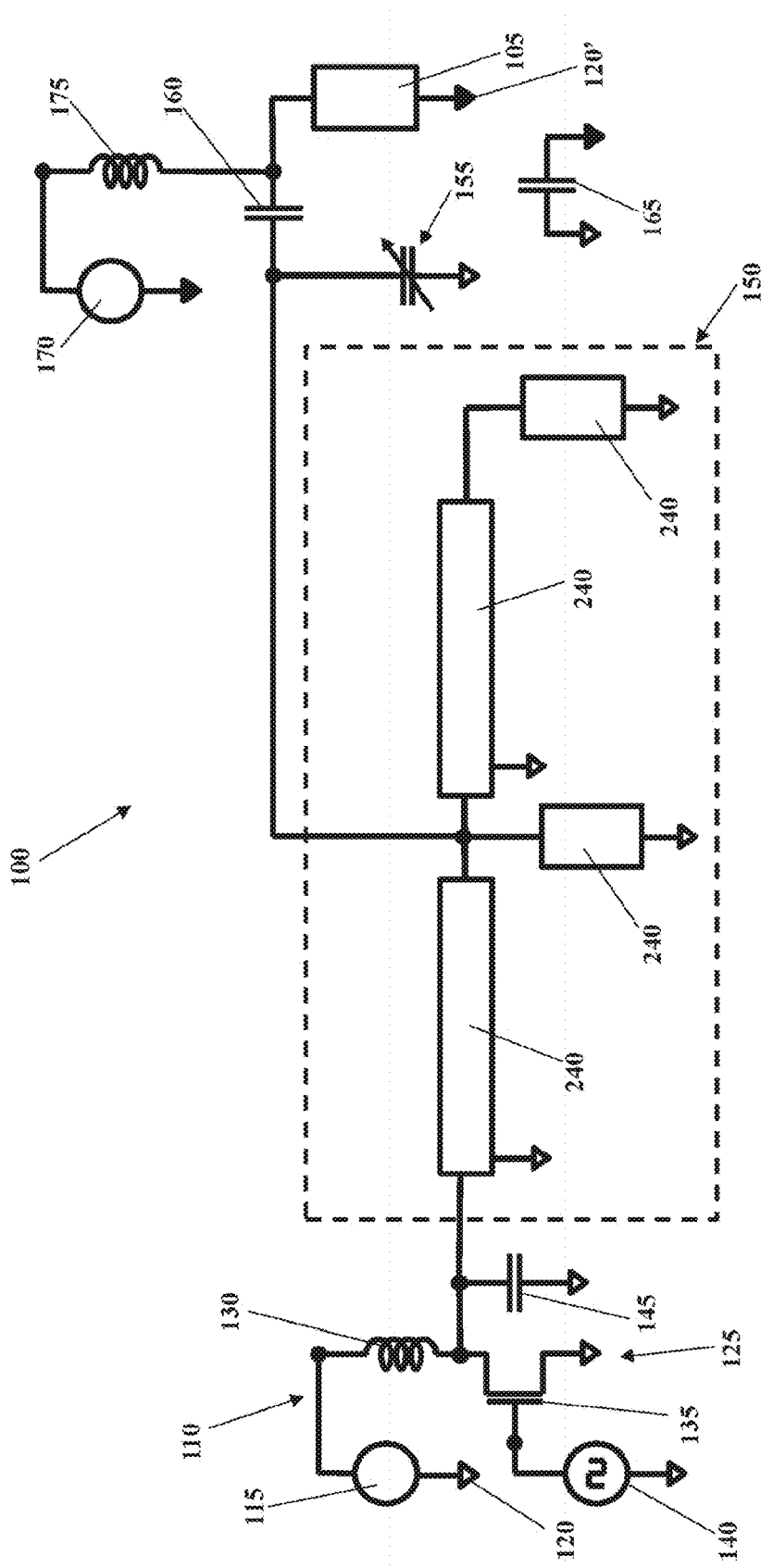

In an alternative embodiment illustrated in FIG. 12, the passive filter 150 can be realised using reactive components distributed, for example by means of the transmission lines 240.

The transmission lines 240 can be for example based on lengths of coax cables, microstrips, balanced lines such as twisted pairs, quad stars, twin-leads, lecher lines or single cable lines, or other types of transmission lines, even looped, for obtaining a passive filter 150 appropriately dimensioned for attaining the aim of controlledly amplifying and damping each harmonic.

The transmission lines 240 are in fact in themselves modellable elements, comprising at least an inductance distributed in parallel to a distributed capacitance, and therefore able to resonate for infinite frequency values, multiples of a fundament frequency dependent on the geometric and constructional characteristics of the transmission line.

By appropriately connecting one or more transmission lines 240 and possible concentrated adapting reactive loads, it is therefore possible to obtain the desired filter useful for realising the drive circuit 100.

Obviously a technical expert in the sector might make modifications of a technical-applicational nature to the above-described drive circuit 100 and the relative functioning method, without forsaking the scope of the invention as described in the following.

The invention claimed is:

1. An electrical circuit (100), comprising at least:
    an electric load to be driven (105)
    a generator (110) of an electric current waveform, and
    a passive filter (150) connected in input to the generator (110) and in output to the electric load (105) to be driven, wherein the passive filter (150) is tuned for generating an electric current waveform resulting from a conditioning of one or more harmonics of the electric current waveforms in input,
    wherein the load (105) to be driven comprises a drive terminal of an active switch, and
    wherein the passive filter (150) is a resonant reactive filter comprising inductors and capacitors,
    characterized in that the passive filter (150) is tuned for amplifying the first harmonic of the electric current waveform with a multiplication factor, completely or nearly completely damping the second harmonic, and amplifying the third harmonic with an amplification factor equal to one third of the multiplication factor of the first harmonic,
wherein the generator (110) of the current waveform comprises:
a generator (115) of direct electric current,
a switching circuit (125) able to convert the direct electric current into an electric current waveform,
wherein the switching circuit (125) comprises at least:
an active switch (135)
a driver (140) for generating an electrical driver signal able to switch the active switch (135) on and off,
wherein the switching circuit (125) comprises an inductance (130) connected in series between the generator (115) of direct electric current and the active switch (135), the passive filter (150) having an input terminal connected with an electrical node interposed between the inductance (130) and the active switch (135), and
wherein the passive filter (150) comprises a plurality of electrical modules (195) including at least a first electrical module and a second electrical module, wherein the first electrical module comprises at least:
a first electric branch (200) branching from the input terminal,
a second electric branch (205) connecting an output terminal of the first electric branch (200) with a reference potential,
a capacitance (225) comprised in the second electric branch (205),
an inductance (215) comprised in the first electric branch (200), and
an inductance (230) comprised in the second electric branch (205), and wherein the second electrical module comprises at least:
a first electric branch (200) connected to the output terminal of the first electric branch (200) of the first electrical module,
a second electric branch (205) connecting an output terminal of the first electric branch (200) of the second electrical module with a reference potential,
a capacitance (225) comprised in the second electric branch (205) of the second electrical module, and
an inductance (215) comprised in the first electric branch (200) of the second electric module, and
an inductance (230) comprised in the second electric branch (205) of the second electric module.

2. The circuit (100) of claim 1, wherein each electrical module (195) comprises a first inductance (215) comprised in the first electric branch (200) and a second inductance (230) arranged in series with the capacitance (225) in the second electric branch (205).

3. The circuit (100) of claim 1, wherein each electrical module (195) comprises a capacitance (220) connected in parallel to the inductance (215) of the first electric branch (200).

4. The circuit (100) of claim 1, wherein each electrical module (195) comprises a further capacitance (210) comprised in the first electric branch (200).

5. The circuit (100) of claim 1, wherein the electrical load to be driven (105) is connected to the output terminal of the first electric branch (200) of the first electrical module (195) of the passive filter (150).

6. The circuit (100) of claim 1, comprising a regulatable reactive load (155) connected to the output of the passive filter (150).

7. The circuit (100) of claim 6, wherein the regulatable reactive load (155) comprises at least one electric branch (180) connecting the output of the passive filter (150) with a reference potential and comprising at least a reactance (185) and at least a switch (190) connected in series with the reactance (185).

8. The circuit (100) of claim 6, wherein the regulatable reactive load (155) comprises at least an electric branch (180) connecting the output of the passive filter (150) with a reference potential and comprising at least a reactance (185), at least a diode (300), a further electric branch (305) connected to a node of the electric branch (180) comprised between the reactance (185) and the diode (300), and a digital signal applied to the further electric branch (305).

9. The circuit (100) of claim 8, wherein a resistance (310) and an inductance (315) are arranged in series on the further electric branch (305).

10. The circuit (100) of claim 6, wherein the regulatable reactive load (155) comprises at least an electric branch (180) connecting the output of the passive filter (150) with a reference potential and comprising two varicap diodes (320) located on the electric branch (180) with the respective cathodes connected together, and a direct current generator (325) for applying a regulatable tuning current to the cathodes of the varicap diodes (320).

* * * * *